United States Patent [19]
Furukawa et al.

[11] Patent Number: 5,181,020
[45] Date of Patent: Jan. 19, 1993

[54] THIN-FILM MAGNETIC MATERIAL AND PROCESS OF PRODUCTION THEREOF

[75] Inventors: Shinji Furukawa; Kazuki Oka; Akira Tanimura, all of Kyoto, Japan

[73] Assignee: Unitika, Ltd., Hyogo, Japan

[21] Appl. No.: 673,550

[22] Filed: Mar. 22, 1991

[30] Foreign Application Priority Data

Mar. 23, 1990 [JP] Japan .................. 2-075247

[51] Int. Cl.⁵ .......................................... G08B 13/24
[52] U.S. Cl. .................................. 340/551; 148/100; 204/192.1; 340/572; 428/900
[58] Field of Search ............... 340/572, 551; 148/100, 148/302, 304; 204/192.1; 428/900

[56] References Cited

U.S. PATENT DOCUMENTS

| | | | |
|---|---|---|---|
| 3,765,007 | 10/1973 | Elder | 340/280 |
| 4,222,517 | 9/1980 | Richardson | 235/493 |
| 4,236,946 | 12/1980 | Aboaf et al. | 148/302 |
| 4,298,862 | 11/1981 | Gregor et al. | 340/572 |
| 4,484,184 | 11/1984 | Gregor et al. | 340/572 |
| 4,510,490 | 4/1985 | Anderson, III et al. | 340/572 |
| 4,660,025 | 4/1987 | Humphrey | 340/572 |
| 4,960,651 | 10/1990 | Pettigrew et al. | 340/551 |
| 4,980,670 | 12/1990 | Humphrey et al. | 340/551 |

OTHER PUBLICATIONS

Dai 13 Kai Nihon Oyo Jiki Gakkai Gakujutsu Koen Yoshishu (Resume for the 13th Lecture of the Magnetics Society of Japan), p. 24aE-7.
The Physical Review, vol. 37, No. 7, Apr. 1, 1931, Minneapolis, Minn. USA K. J. Sixtus et al. "Propagation of Large Barkhausen Discontinuities", pp. 930–958.
The Physical Review, vol. 39, second series, Jan.-Mar. 1932, Minneapolis, Minn, USA K. J. Sixtus et al., "Further Experiments on the propagation of Large Barkhausen Discontinuities", pp. 357–358.
The Physical Review, vol. 42, second series, Oct.-Dec. 1932, New York K. J. Sixtus et al. "Propagation of Large Barkhausen Discontinuties II", pp. 419–436.
The Physical Review, vol. 43, second series, Jan.-Jun. 1933, New York, USA L. Tonks et al. "Propagation of Large Barkhausen Discontinuties IV, Regions of Reversed Magnetization", pp. 931–940.
The Physical Review, vol. 43, second series, Jan.-Jun. 1933, USA L. Tonks et al., "Propagation of Large Barkhausen Discontinuities, III. Effect of a Circular Field with Torsion", pp. 70–80.
IEEE Transactions on Magnetics, vol. Maj.-17, No. 6, Nov. 1981 K. Mohri et al., "Sensitive Magnetic Sensors Using Amorphons Wiegend-Type Ribbons", pp. 3370–3372.
Physikalische Zeitschrift, XX, Jahrgang, 1919 Dr. P. Debye "Barkhausen, zwei neue Erscheinungen", pp. 401–403.

*Primary Examiner*—Glen R. Swann, III
*Attorney, Agent, or Firm*—Sughrue, Mion, Zinn, Macpeak & Seas

[57] ABSTRACT

A thin-film magnetic material is formed on a polymer substrate. The material exhibits large Barkhausen discontinuity without intentional application of external tensile or torsional stress. The thin-film material may be produced by a sputtering technique wherein the normal to the substrate is directed obliquely to a target member. A biasing magnetic field in proximity to the substrate may also be used during film formation, and the substrate may be supported by a curved holder or a cylindrical roll-to-roll apparatus. The thin-film thus produced may be used as a marker in an article surveillance system or as a magnetic sensor.

25 Claims, 7 Drawing Sheets

THIN-FILM MAGNETIC MATERIAL AND PROCESS OF PRODUCTION THEREOF

FIELD OF THE INVENTION

The present invention relates to a thin-film magnetic material useful for magnetic markers and magnetic sensors; and, a process for producing such thin-film magnetic materials. More particularly, the present invention relates to a thin-film magnetic material, which is constituted of a magnetic thin film formed on a surface of a substrate composed of an organic polymer material. This material exhibits large Barkhausen discontinuity without intentional application of external torsional or tensile stress on use. The present invention also relates to a process for producing the thin-film magnetic material, and various elements utilizing the material.

BACKGROUND OF THE INVENTION

Magnetically soft materials are used widely as magnetic cores and electromagnetic shielding materials; such as in transformers, magnetic heads, and magnetic sensors. Such materials are required to have suitable characteristics for thir respective uses. For example, higher magnetic permeability is desired for magnetic head materials, and smaller iron loss is desired for transformer materials. Magnetically soft materials are also used, for example, for sensors in which pulse voltages are abruptly generated by combined use of an electromagnetic induction type pick-up coil. The materials exhibiting large Barkhausen discontinuity, which undergoes extremely rapid magnetic reversal, are very useful for such pulse generating elements and are widely utilized.

The "large Barkhausen discontinuity" referred to above is a phenomenon of instantaneous magnetic reversal in a material caused by application of a critical magnetic field, which results in an extremely steep linear rise in the magnetic hysteresis loop, namely a jump in magnetization. In a magnetization process, a typical magnetic substance is magnetized uniformly and continuously with increase of the intensity of an applied magnetic field. In contrast, a substance exhibiting a large Barkhausen discontinuity is magnetized discontinuously on applying a magnetic field. Barkhausen discontinuity is frequently observed in typical magnetic substances as a step-like noise. This phenomenon is believed to be due to abrupt movement of magnetic domain walls resulting from disappearance of restrictions on their movement caused by grain boundaries in the magnetic substance when the intensity of the applied magnetic field is increased. This Barkhausen discontinuity is observed as a step shape when the magnetic hysteresis loop is magnified, and the jump in magnetization is not so large.

H. Barkhausen, who first identified the Barkhausen discontinuity in 1919, reported that a single domain causing one of the Barkhausen discontinuity reversals has a size of approximately $10^{-8}$ cc [H. Barkhausen: Phys. Z. 20 (1919) 401]. On the contrary, in a *large* Barkhausen discontinuity, a far larger portion in comparison with usual Barkhausen discontinuity, several % to several ten % of the specimen is simultaneously magnetized and oriented, exhibiting extremely steep discontinuous magnetization in the magnetic hysteresis loop. Since no formal definition exists regarding the lower limit of large Barkhausen discontinuities at present, the phenomenon of discontinuous magnetization exceeding 10% of the saturation magnetization will be defined as "large Barkhausen discontinuity" in the present invention.

The large Barkhausen discontinuity is observed, at the moment of application of a critical magnetic field having intensity H*, as a jump in magnetization caused by abrupt movement of magnetic walls. Practically, the movement of the magnetic walls, and the speed thereof, can be observed and measured, which is one of the characteristics of the large Barkhausen discontinuity phenomenon. In other words, the large Barkhausen discontinuity may be confirmed by observation. For example, the movement of the magnetic domain walls and the velocity thereof are directly observable according to the methods reported by K. J. Sixtus and L. Tonks (Phys. Rev., Vol. 37, (1931) p. 930; Vol. 39 (1932) p. 357; Vol. 42 (1932) p. 357; vol. 43 (1933) p. 70 and p. 931; and so forth.

As shown in FIG. 2 in above-cited Phys. Rev. Vol. 37 (1931), p. 930, a specimen is magnetized in one direction by means of a main coil capable of applying a magnetic field to the whole specimen to give it a single domain structure. Thereafter, the electric current flowing through the main coil is gradually decreased to zero, and then the magnetic field is applied in the reverse direction with gradual increase up to slightly lower level than the critical magnetic field intensity H*. By this process, the specimen is first magnetized in a single magnetic domain structure; and, subsequently, is subjected to a magnetic field in the direction reverse to that of the first magnetization. At this stage, if a magnetic field of intensity H* is applied by means of an additional coil placed at the end of the specimen in the same direction as that of the main coil, reverse magnetic domains are formed at the position of the additional coil, and the magnetic domain walls move extremely rapidly toward the other end of the specimen.

This movement of the magnetic domain walls is detected as pulse voltages by two search coils I and II placed at intermediate positions along the length of the specimen. The velocity of movement of the magnetic domain walls is measured by the time lag of the voltage induction at the search coils I and II, which are placed at separate positions. The number of magnetic domains having moved between the search coil I and the search coil II can be counted by the number of the generated pulses. In the case of the large Barkhausen discontinuity phenomenon, only one pulse, instantaneous long-range movement of only one magnetic domain wall, can be detected by suitably controlling the magnetic field created by the main coil and the additional coil. Therefore, this procedure may be utilized for confirmation of the large Barkhausen discontinuity phenomenon.

The large Barkhausen discontinuity phenomenon is observed, for example, in a thin ribbon of iron based amorphous alloy which has been annealed in a twisted state and when used, reformed by applying torsional stress in the direction opposite to that applied in annealing, and in Wiegand wire of an Fe-Co-V alloys and Fe-Ni type alloy having a stress double-layer introduced by working a slender wire. The phenomenon of the discontinuous magnetization of the Wiegand wire is generally called the Wiegand effect, and is substantially the same as the aforementioned large Barkhausen effect (or discontinuity).

Recently, a wire of amorphous alloy having large magnetostriction properties prepared by an in-rotating-water melt spinning method has been found to exhibit extremely sharp large Barkhausen discontinuity as it is formed without further working nor annealing under torsion stress. These alloys have come to be used for various magnetic sensors.

The above examples are based on the magnetization behavior of a magnetic substance with a large magnetostriction in a field of stress including internal stress. On the other hand, a magnetic substance was reported which is almost free from magnetostriction and yet exhibits large Barkhausen discontinuity, in the preprint of the 13-th Meeting of the Magnetics Society of Japan, p. 370. This report discloses that a Co-Fe based amorphous alloy ribbon of 0.8 mm in width, 30 $\mu$m in thickness, and 40 mm in length, and having no magnetostriction, came to exhibit large Barkhausen discontinuity after annealing at 300° C. for 30 minutes with a static magnetic field of 100 Oe and subsequent annealing at 300° C. for 30 minutes without application of a magnetic field. This is considered to be due to the fact that magnetic domain walls were formed and fixed in a portion of the thin ribbon by annealing, which controls the movement of other domain walls, resulting in large Barkhausen discontinuity.

Commercial products utilizing the large Barkhausen discontinuity include article surveillance magnetic markers, magnetic sensors, rotation sensors, and the like.

The article surveillance magnetic markers are utilized in surveillance systems in retail stores, libraries, and so forth to prevent unpermitted removal of articles to be sold, or books from libraries. When a marked article is carried out through a monitored area, the surveillance system detects the passing article from a remote place according to the marker preliminarily attached to the article. Among the markers, those employing magnetic substances are widely used in retail stores and other places because of their small size and inexpensiveness, which are suitable for disposable articles. A ferromagnetic substance is incorporated in the marker, while a calling-signal-transmitting coil and a signal-receiving search coil are installed in the surveillance area. When the ferromagnetic substance is magnetically reversed by the specific frequency of cyclic magnetic field of the transmitted calling-signal, a voltage is induced by electromagnetic induction in the search coil. The more rapid the magnetization behavior of the magnetic substance, the steeper the pulse voltage generated, and the higher the order of the harmonic wave generated for the frequency of the calling cyclic magnetic field. The surveillance system utilizes the presence or absence of harmonic waves for detection.

The ferromagnetic substance employed as the marker must be selected so that its emitted signal may be differentiated from the other signals given off by an ordinary magnetic material, such as a shopping basket or a wristwatch, etc. as distinctly as possible. Therefore, markers are normally made of a material having magnetic characteristics differing greatly from those of ordinary magnetic materials. That is, the material is of high magnetic permeability which magnetically becomes reversed extremely rapidly in response to the applied cyclic magnetic field; or, in other words, as disclosed in U.S. Pat. No. 4,660,025, a material exhibiting large Barkhausen discontinuity.

The examples of markers specifically described in U.S. Pat. No. 4,660,025 are amorphous metal wires and amorphous metal ribbons. The amorphous metal wire is made of an alloy having the composition $Fe_{81}Si_4B_{14}C_1$ (atomic %), being 125 $\mu$m in diameter and 76 mm in length. This metal wire is shown to exhibit large Barkhausen discontinuity under a critical magnetic field H* of 1.0 Oe or less and to generate signals discernible to a 99-th harmonic wave in response to an inputted cyclic magnetic field of 60 Hz, which is far sperior to the "METGLAS" (trade name, made by Allied Corporation, Fe-Co based amorphous metal ribbon) and a permalloy ribbon which are described as comparative examples. On the other hand, the amorphous metal ribbon described is subjected to torsion-annealing. For preparation thereof, an amorphous metal ribbon having a composition of $Fe_{81}Si_4B_{14}C_1$ (atomic %), 2 mm wide, 25 $\mu$m thick, and 3 to 10 cm long, is annealed under application of torsional stress at 380° C. for 25 minutes, and the resulting ribbon is reformed by holding between films or the like, whereby stress is introduced to induce discontinuous magnetization.

The above-cited U.S. Pat. No. 4,660,025 also describes an apparatus for discerning the marker signals. The discerning apparatus comprises a transmitting section and a receiving section. In the transmitting section, a magnetic field-generating coil is connected to a frequency generator. In the receiving section, a high-pass filter, a frequency-selective detecting circuit, and a warning unit are connected to a magnetic field-detecting coil. In the transmitting section, a cyclic magnetic field of a predetermined frequency is generated as a calling signal. The magnetic field-detecting coil in the receiving section receives from the marker the transmitted signal and the signal containing harmonic waves of the transmitted signal. The signals are filtered by a high-pass filter to eliminate signals of lower frequency, and fed to the frequency-selective detecting circuit. The warning unit is actuated when a predetermined frequency pattern, amplitude, or pulse interval is detected by the frequency-selective detecting circuit.

The magnetic field sensor detects an external magnetic field based on the presence of the critical magnetic field H* which induces the large Barkhausen discontinuity. By application of a magnetic field of H* or stronger, a pulse voltage is generated in a search coil placed near a material exhibiting large Barkhausen discontinuity. From the presence or absence of, or the number of pulses generated, the state of the magnetic field is detected. Thus, magnetic fields stronger than H* and weaker than H* can be detected digitally by two responses: ON or OFF. These types of sensors are characterized by reliable action, even with extremely slow change of external magnetic field that cannot actuate a conventional electromagnetic induction type sensor employing a high magnetic permeability material.

The rotation sensors represent another application field of the magnetic sensor. A measured object is equipped with a magnetic field-applying means such as a permanent magnet. In the vicinity thereof, a sensor is placed which comprises a large Barkhausen discontinuity material and a search coil. The rotation speed is measured by the number of pulse voltages generated in the sensor by the critical magnetic field H*. This rotation sensor is characterized by a broad measuring range of from extremely slow rotation to high speed rotation.

In the prior art, the materials exhibiting large Barkhausen discontinuity are very limited, and the shapes of the materials are classified into thin ribbon types and wire types. Thus thin ribbon type materials, which are made from amorphous metal ribbon to be annealed in a twistes state, needed to be subjected to torsional stress-application in the direction opposite to the twist direction in annealing, when used. The treatment is conducted, for example, according to the description in IEEETRANS. MAG. VOL. MAG-17, No. 6, November, pp. 3370-3372 (1981). In such a procedure, an amorphous alloy ribbon about 1 mm wide and about 0.035 mm thick, having the composition of $Fe_{80}B_{20}$ (atomic %) in a toroidal shape of 4 to 8 mm in diameter, is annealed at a temperature of not lower than the Curie temperature and lower than the crystallization temperature, and subsequently it is reformed by application of torsional stress in the direction opposite to that in annealing, on use to induce a properties of large Barkhausen discontinuity. By this treatment, a torsional stress of from 45 to 90 $kg/mm^2$ was applied to the specimen. However, annealing a two-dimensional article like a ribbon under application of torsional stress is not readily practicable industrially. Furthermore, the above-cited reference describes the necessity of reforming the thin ribbon forcibly by some method, which undesirably limits the structure and uses of elements or the like employing the thin ribbon.

In contrast, the materials not requiring stress application are exemplified by Wiegand wires and amorphous alloy wires. The Wiegand wires, however, have been used only in limited applications because the wire requires, for magnetic reversal, a critical magnetic field $H^*$ of as strong as several Oe to several ten Oe and the vibration of the critical magnetic field intensity $H^*$, i.e., jitter, is large, resulting in low precision.

In contrast, the amorphous alloy wires have excellent characteristics because the critical magnetic field $H^*$ required for magnetic reversal is not stronger than several Oe, and is controllable arbitrarily by the process of preparation. This field is highly precise, with a vibration of critical magnetic field $H^*$ of not more than 5%, and the pulse generated in the coil is extremely steep, and the harmonic wave components are remarkably predominant. For this reason the amorphous alloy wires are widely used as a material for article surveillance magnetic markers, rotation sensors, and the like. However, the applications were limited because of the wire-like shape. Further, extreme shortening of the wire makes the demagnetizing field stronger, thereby suppressing the large Barkhausen discontinuity phenomenon, which limits miniaturization. For example, the above-cited U.S. Pat. No. 4,660,025 discloses that the demagnetizing factor must be less than 0.000125, therefore, the amorphous metal wire is required to be in a size range of from 90 to 150 μm in diameter and from 10 to 100 mm in length.

The amorphous metal wires exhibit large Barkhausen discontinuity under no stress application, but application of stress may sometimes suppress the large Barkhausen discontinuity. Accordingly, the wires should be designed to be free from undesired stress insofar as possible. A practical marker is constituted of a sheet of release paper, a double-sided adhesive tape, an amorphous metal wire, and a sheet of protective paper to hold the amorphous metal wire, all being devised to avoid unnecessary stress. It was considerably difficult in many cases to support a special shape of thin thread by avoiding stress.

A thin film configuration is generally understood to be effective in achieving small size and a flat shape. Therefore, a thin film configuration of a material exhibiting large Barkhausen discontinuity, if it could be obtained, could be expected to be used extensively in a wide range of applications.

Use of an organic polymer substrate could result in mass production at low cost with expansion of the field of use. This may be easily understood by following the development of magnetic tape. Further, the thin-film to which tensile or torsional stress must be applied on use were extremely limited in the purpose thereof.

Although there is no prior art clearly disclosing a thin-film material exhibiting large Barkhausen discontinuity, it is possible to produce thus thin-film material using the above described processes, wherein amorphous metal thin ribbon having magnetostriction is heat treated under torsional stress being applied or that having no magnetostriction is heat treated in a magnetic field.

However, for wide use as sensors and article surveillance magnetic markers, the large Barkhausen discontinuity thin film is naturally required to be continuously produced with an inexpensive substrate, without applying stress intentionally on use. A film composed of organic polymers is suitable as the substrate therefor.

On investigation of the aforementioned production methods, it is easily understood that none of the production processes employed a substrate of an organic polymer. The organic polymer substrate is not resistant to the temperature required in heat treatment necessary in any prior art process. In particular, the process comprising heat treatment with torsional stress being applied requires a continuous application of stress on use, with disadvantage.

Accordingly, the development of a magnetic thin film which exhibits large Barkhausen discontinuity, formed on an organic polymer substrate, not requiring intentional stress application on use, and any heat treatment after film formation is desireable, but no such film has ever been produced.

After comprehensive studies to solve the above problems, the inventors of the present invention found that a magnetic thin film which has remarkably large Barkhausen discontinuity characteristics, formed without intentional application of stress, can be produced even by use of an organic polymer material as the substrate. This may be accomplished by forming the thin film by a sputtering method, introducing the thin-film-constituting particles mostly in oblique direction to the substrate, or specifically by placing the substrate in a direction oblique to the target face.

SUMMARY OF THE INVENTION

An object of the present invention is to provide a magnetic thin film which exhibits large Barkhausen discontinuity characteristics formed on an organic polymer material without intentional application of stress.

Another object of the present invention is to provide a process for producing a thin-film magnetic material having the characteristics described above.

Still another object of the present invention is to provide a marker for use for an article surveillance system employing the above-described thin-film magnetic substance.

A further aspect of the present invention is to provide a magnetic sensor employing the above-described thin-film magnetic material.

A still further object of the present invention is to provide a rotation sensor employing the above-described thin-film magnetic material.

According to an aspect of the present invention, there is provided a thin-film magnetic material having a magnetic thin film formed on a polymer substrate. The thin film exhibits large Barkhausen discontinuity without intentional application of external torsional or tensile stress on use.

According to another aspect of the present invention, there is provided a process for producing a thin-film magnetic material having a magnetic thin film formed on a polymer substrate and exhibiting large Barkhausen discontinuity without intentional application of external torsional or tensile stress on use. In this process, the magnetic thin film is formed by sputtering on a substrate oriented such that the normal line of the substrate is directed obliquely to a target plate, particularly at an angle of from 5° to 85° to the target.

According to still another aspect of the present invention, a marker is provided for use in an article surveillance system. Such systems identify an article by forming a cyclic magnetic field of a predetermined frequency in a surveillance area, attaching a magnetic substance preliminarily onto the article to be identified, and detecting a harmonic wave of the magnetic field generated by the article brought into the surveillance area. The marker described herein is constituted of a thin-film magnetic material formed on a polymer substrate, and exhibits large Barkhausen discontinuity without intentional application of external torsional or tensile stress on use.

According to a further aspect of the present invention, a magnetic sensor is provided which is constituted of a magnetic core portion and a coil portion placed around the core portion. The core portion comprises a magnetic thin film formed on a polymer substrate, and the thin film exhibits large Barkhausen discontinuity without intentional application of external torsional or tensile stress on use.

According to still another aspect of the present invention, a rotation sensor is provided which is constituted of a magnetic sensor composed of a magnetic core portion and a coil portion, and a magnetic field-applying means composed of a permanent magnet or an electromagnet. The magnetic field-applying means is attached to a rotating article, and the core portion being placed in proximity to the magnetic field-applying means. The core portion comprises a thin-film magnetic material formed on a polymer substrate and exhibiting large Barkhausen discontinuity without intentional application of external torsional or tensile stress on use.

BRIEF DESCRIPTION OF THE DRAWINGS

FIG. 1A is a schematic side view of the apparatus, and FIG. 1B is a schematic plan view of a magnetron cathode of the apparatus.

FIG. 2A is a schematic side view of the apparatus, and FIG. 2B in a schematic plan view of a magnetron cathode of the apparatus.

FIG. 3A shows the change of magnetization on application of the cyclic magnetic field of up to 0.4 Oe to the specimen. FIG. 3B shows the change of magnetization on application of the cyclic magnetic field of up to 0.5 Oe to the specimen.

FIG. 4A is a schematic side view of the apparatus, and FIG. 4B in a schematic plan view of a magnetron cathode of the apparatus.

FIG. 6A shows the change of magnetization on application of the cyclic magnetic field to a speciment up to 0.3 Oe. FIG. 6B shows the change of magnetization on application of the cyclic magnetic field to a specimen up to 0.35 Oe.

As shown in FIGS. 1(A), 1(B), 2(A), 2(B), 4(A), 4(B), 5(A) and 5(B), the meanings of the symbolic numerals are as follows: 1: a target, 2 and 3: permanent magnets, 4 and 5: yokes, 6: a back yoke, 7: a shutter, 8: a substrate holder, 9: substrate film, 10: a baffle plate, 11: a main roll, 12: substrate film, 13; a lead-on roll, 14: a take-up roll.

DETAILED DESCRIPTION OF THE INVENTION

Figure 1A:
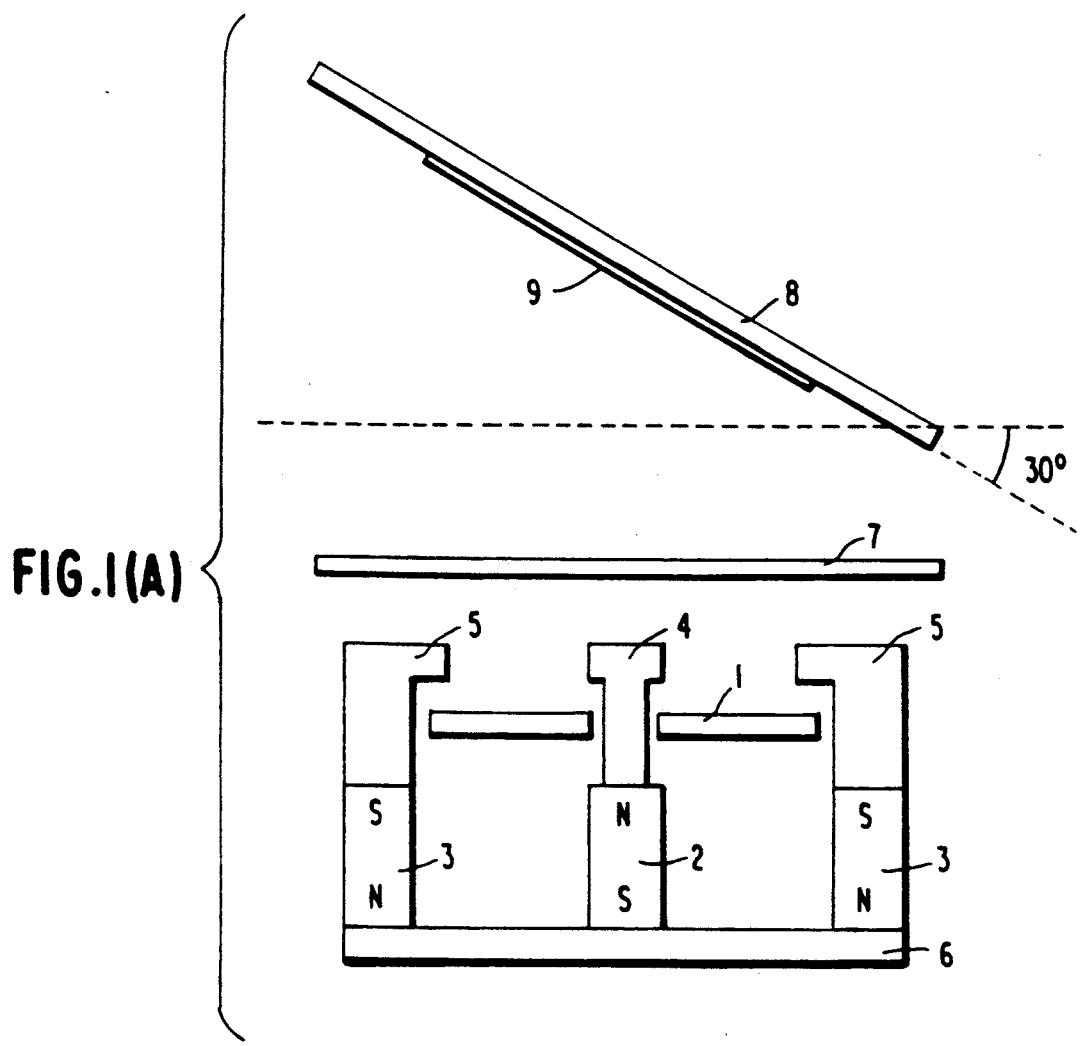
FIGS. 1A and 1B are schematic views of a batch type DC magnetron sputtering apparatus for producing the thin-film magnetic material of the present invention.

I. The material exhibiting large Barkhausen discontinuity

The thin-film magnetic material of the present invention exhibits large Barkhausen discontinuity without intentional application of external torsional or tensile stress on use. The substance constituting the magnetic thin film should be a "magnetostriction-exhibiting substance" which has a non-zero magnetostriction constant. Examples thereof are an Fe-Ni alloy, and an Fe-Co-V alloy. In cases where a low critical magnetic field H* for the large Barkhausen discontinuity is desired, amorphous alloys are preferable. In this case, the magnetostriction constant may be either positive or negative, but should not be of an extremely small absolute value. As an example, an amorphous alloy (Fe-Co)$_{75}$Si$_{10}$B$_{15}$ (atomic %) changes its magnetostriction continuously from a positive value to a negative value depending on the ratio of Fe to Co, where the ratio of Fe to Co is preferably in the ranges of from 0:100 to 90:10, and from 97:3 to 100:0 in atomic ratio.

A material exhibiting magnetostriction of large absolute value, whether positive or negative, is capable of constituting the magnetic thin film of the present invention. Amorphous alloys of Fe$_{75}$Si$_{10}$B$_{15}$ (atomic %, exhibiting positive magnetostriction) and $Co_{75}Si_{10}B_{15}$ type (atomic %, exhibiting negative magnetostriction) are both preferable as the magnetic thin film of the present invention. Although substances mainly constituted of Fe or Co are preferable in the present invention, substances mainly constituted of Ni are also preferable. Additionally, those containing B, particularly Si and B, are still more preferable in the present invention. The B content is preferably within the range of from 5 to 30 atomic %, and the Si content is preferably not higher than 20 atomic %, the total content of B and Si being not lower than 10 atomic % and not higher than 30 atomic %. If the B content is below 5 atomic %, the thin film formed is unlikely to be amorphous. On the other hand, if the total content of B and Si exceeds 30 atomic %, the resulting film has undesirably high coercivity and low saturation magnetization. While B-containing systems are most desirable in the present invention, systems containing Zr, Nb, Ti, Hf or the like as a constituent element are also preferable.

In the present invention, an organic polymer is preferably employed as the substrate because it is inexpensive and flexible, and a thin film can be formed thereon continuously. The organic polymer substrate includes films, sheets and plates of a polyester, a polyamide, a polyimide or the like. In particular, films are preferable because of ease of continuous film formation and superiority in workability. If the substrate is to be heated during film formation, a polyimide type material effectively prevents damage to the substrate.

II. Process of production

The thin-film magnetic material described above can be produced, for example, according to the following process.

In the process for producing the thin-film magnetic material of the present invention, most of the particles to be deposited onto the substrate need to be introduced at a non-zero angle relative to the normal line of the substrate, namely in a direction oblique to the substrate. The target and the substrate are appropriately positioned spatially to satisfy the above condition. The normal line of the substrate should be directed at an angle within the range from 5° to 85° to the target. If the substrate is placed parallel to the target, the resulting thin film does not exhibit large Barkhausen discontinuity.

Increasing the fraction of the portion exhibiting the large Barkhausen discontinuity in magnetization of the whole magnetic thin film is effective for strengthening the signal emitted thereby and for decreasing noise components in the signal. For this purpose, the substrate is preferably placed an angle of from 5° to 85°, particularly from 10° to 40°, to the target face.

As the apparatus for producing the thin film, a sputtering apparatus is employed because the apparatus is capable of forming a film from particles having a large kinetic energy to give satisfactory magnetic characteristics, and the resulting film has a composition deviating little from the composition of the target. A preferable example of the sputtering apparatus is a planar type sputtering apparatus. The sputtering method may also include an facing target cathode type, an ion-beam sputtering type, or a laser-beam sputtering type. However, the planar type is the most suitable.

In using the planar type sputtering apparatus, the above-mentioned conditions are satisfied assuming the target is placed horizontally, by placing a substrate in an oblique direction at an angle of from 5° to 85° to horizontal direction. Naturally, the sputtering apparatus is capable of holding the target in any direction from horizontal to vertical, which is true also in the present invention. The substrate need only be placed in an oblique direction relative to the target face; the sputtering cathode may be placed in as efficient a position as possible in the production process.

Even in the case where the target and the substrate are placed parallel to one another, the number of particles which are introduced in an oblique direction can be increased by placing the substrate apart from and directly above the target. Such positioning, however, decreases the efficiency of film deposition and decreases control over the direction at which particles are introduced, in comparison with the oblique placing of the substrate. Such positioning does not readily impart a sufficiently large Barkhausen discontinuity to the system; and, in particular, results in remarkably lower reproducibility in production.

Usually, a glass or ceramic plate used as the substrate for a magnetically soft material is not deformable. Therefore, the film is deposited by a batch process or a semi-continuous process employing a cassette type substrate holder in a plane shape, to bring the substrate into contact with the substrate holder.

On the contrary, a substrate made of a polymer material is very flexible. Thus, a substrate can conform closely to the substrate holder in any shape. This increases the number of sputtered particles introduced in an oblique direction. When a polymer substrate is closely contacted with a curved substrate holder and the target is horizontally placed, the angle between the target and the substrate becomes larger as the distance directly above the target is increased; thus, the chance of oblique introduction is increased.

Uniform characteristics in the thin film on the substrate plane by use of such a holder is achievable by moving the holder and the substrate at an appropriate speed. The constant incident angle of the sputtered particles throughout the substrate is achievable by rotating the holder around the center of the curvature of the holder. The rotation of the holder changes the incident angle gradually in every point on the substrate, making the rate of the angle change constant at every position on the substrate. For keeping the incident angle of the sputtered particles constant insofar as possible during the film formation, a baffle plate may be placed between the target and the substrate for controlling the adhesion of the sputtered particles. In such a manner, the film is deposited only when the portion of the substrate comes to the opening of the baffle plate, thereby the incident angle of the sputtered particles is controlled.

Further, the use of a polymer substrate is also significantly advantageous in productivity since continuous film formation is feasible using a "roll-to-roll method". In such a method, which a substrate material, a polymer film continuously wound in roll, is delivered from lead-on roll sequentially and is taken up after deposition with a take-up roll. In the roll-to-roll method, continuous film deposition on a substrate in a curved state is readily achievable by bringing a polymer film fed from a lead-on roll into close contact with a cylindrical main roll, conducting deposition on the substrate in this state, and taking up by a take-up roll.

As an example, in the roll-to-roll method, a sputtering cathode is placed directly below the main roll to keep the target oriented horizontally, and the film deposition is conducted while the substrate is on the main roll. More specifically, the film deposition is conducted on the substrate at a large angle to the target face when the substrate film has reached the film deposition region. The angle becomes smaller gradually with the movement of the film, and becomes zero, namely parallel to the target face at the lowest point of the main roll, and thereafter with further movement of the film, the angle becomes gradually larger again. Such placement of the substrate results in an initially large incident angle of sputtered particles, gradually increases perpendicular introduction of the particles, and then increases the oblique introduction of the particles. Accordingly, the process of production of the present invention can readily be conducted. The thin film prepared in such a manner is characterized by its large Barkhausen discontinuity nearly uniform in length direction of the continuous substrate since the film is fed sequentially to the main roll and the particles are introduced in the same distribution from the beginning to the end of the film deposition. Therefore the deposition is conducted in high reproducibility.

Further, in the roll-to-roll method, a baffle plate may be provided so as to conduct the deposition only in a limited range of the main roll so that the deposition may be conducted at a predetermined range of the angle of the substrate to the target face. For example, if the opening of the baffle plate is placed around the center line of the main roll, the deposition is conducted at the angle of the substrate of approximately zero to the target face. For achieving the purpose of the present invention, however, the baffle plate is placed to cover the neighborhood of the center line of the main roll to achieve more remarkable effect of the oblique introduction.

A thin film exhibiting large Barkhausen discontinuity by use of an organic polymer substrate is readily achievable with a curved substrate holder, particularly by a roll-to-roll method. Further, it is very effective to apply a biasing magnetic field simultaneously during the deposition to control the magnetic characteristics of the magnetic film. For example, the easy axis of magnetization, which is greatly affected by pressure and temperature of the sputtering, can be readily controlled by the application of a biasing magnetic field during the deposition. For this purpose, a permanent magnet may be placed in proximity to the substrate holder or the main roll to apply a static biasing magnetic field. In this method, the magnetic thin film is magnetized nearly in a single magnetic domain during deposition. The deposition can also be conducted to produce a thin film having a plurality of magnetic domains, or magnetic domain "walls". For this purpose, a multipole magnet having alternating S poles and N poles is placed at the back side of the substrate holder or behind an inside face of the main roll. These measures are also effective for increasing the range of the thin film exhibiting the large Barkhausen discontinuity.

As already mentioned, a planar magnetron sputtering apparatus is effective in production of a magnetic thin film material of the present invention exhibiting large Barkhausen discontinuity. This is described in more detail below.

In a magnetron sputtering apparatus, an electric field is applied to a target as a cathode, and a magnetic field is applied in a direction perpendicular to the electric field to cause cyclotron movement of charged particles in the plasma to improve sputtering efficiency. In the planar magnetron sputtering apparatus, a permanent magnet or an electromagnet is placed as a magnetic field-applying means under a plate-shaped target to apply leakage magnetic field from the target surface to cause cyclotron movement of the charged particles. If the target is ferromagnetic, the magnetic flux is trapped by the ferromagnetic target; as a result, leakage magnetic field into the space over the target becomes extremely weak. Accordingly, for effective generation of the leakage magnetic field, the target had to be made extremely thin, so one target is capable of producing only a small amount of thin film, lowering the production efficiency. Further, in producing a material exhibiting large Barkhausen discontinuity, the direction of introducing sputtered particles onto the substrate has to be controlled as described above. The direction of the propelled particles is greatly affected by distribution of plasma on the target and the direction and energy of ions sputtered from the target, as well as by the relative spatial arrangement of the substrate and the target. Therefore, these factors should be closely monitored to strictly control the incident direction of the sputtered particles introduced onto the substrate in the present invention, for which the control of the distribution of leakage magnetic field is important in the space over the target. A planar magnetron sputtering apparatus readily allows the aforementioned control over the magnetic field, and will be preferable for producing the thin film material with large Barkhausen discontinuity of the present invention.

For controlling leakage magnetic field on a target in a planer magnetron sputtering apparatus, the intensity distribution and the shape of the magnetic system under the target must be optimized. However, with a conventional planer magnetron sputtering apparatus, the control of the leakage magnetic field is difficult since the target traps the magnetic flux, causing a substantial decrease in the leakage magnetic field.

In such a circumstance, the inventor of the present invention conducted a comprehensive study to achieve control of the leakage magnetic field more readily in the planar magnetron sputtering apparatus. As the result, the inventors have found that the leakage magnetic field can be enlarged and the control thereof can be improved by connecting a yoke with a permanent magnet or an electromagnet under the target. The yoke has one end closer to the substrate than the target face to introduce the magnetic flux generated by the magnet directly into the space over the target. This apparatus has made the production of the thin film material exhibiting large Barkhausen discontinuity much easier.

According to this method, the magnetic flux distribution at the central and circumferential portions of the target can be adjusted by controlling the material, the shape of the yoke, and the magnetic field-applying means (a permanent magnet or an electromagnet). For example, in the state such that the magnetic flux is denser in the circumferential portion than in the central target portion, a narrow-beamed plasma directed toward the target is generated, while in the state such that the magnetic flux is less in the circumferential portion than in the central target portion, strongly divergent plasma diffusing from the target to the circumferential space is generated. Naturally, the plasma can be enclosed over the target by balancing the flux densities in the central target portion and the circumferential portion. In the production process of the present invention, the most effective narrow-beamed plasma is generated in the state such that the magnetic flux is denser in the circumferential portion than in the central target portion. Accordingly, it has been found that a thin film exhibiting large Barkhausen discontinuity, which is exceedingly steep, can be produced by combining the above plasma generation procedure with the method of the present invention where the substrate is placed at an angle of from 5° to 85° to the target to introduce the thin-film-forming particles obliquely. The magnetic flux distribution in the space above the target can be controlled by adjusting the magnetic flux densities and the areas of the magnets under the target and the yokes connected thereon. For example, if a bar-shaped ALNICO permanent magnet is placed at the central portion with its N pole upward and a concentric circular permanent magnet of the same material is placed at the circumferential portion with its S pole upward, the total magnetic flux can be made greater in the circumferential portion than in the central portion by making the pole areas of magnet and the yoke in the circumferential portion larger than those in the central portion. By such a procedure, the quantity of magnetization given by large Barkhausen discontinuity is increased.

As described above, the thin-film magnetic material of the present invention is produced most advantageously by a planar magnetron sputtering apparatus employing a yoke. However, it can be produced by other apparatuses. Accordingly the apparatus is not limited thereto at all and may be selected suitably depending on the desired productivity and later workability.

The present invention is described below in more detail by reference to the accompanying drawings.

Figure 1B:
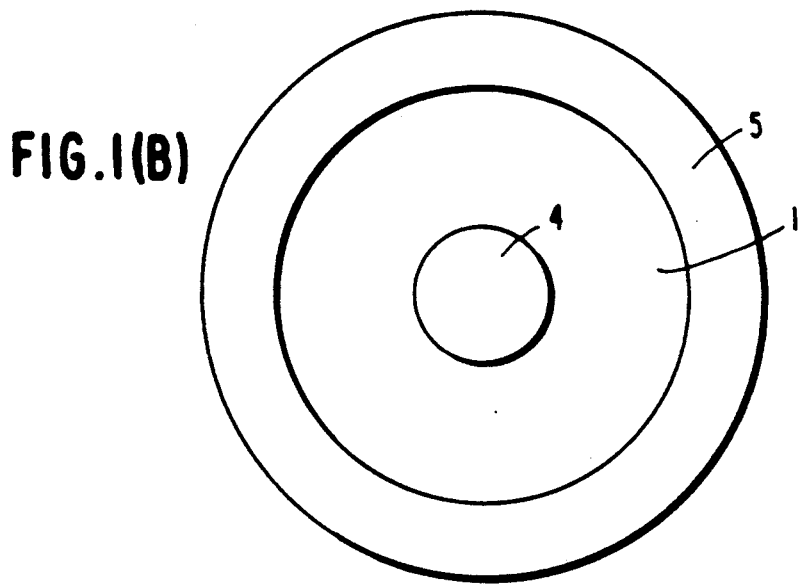

FIGS. 1A and 1B are schematic views of a DC magnetron sputtering apparatus employing a yoke for producing a magnetic thin film having large Barkhausen discontinuity characteristics in batch form. FIG. 1A is a schematic side view of the apparatus and FIG. 1B is a schematic plan view of a magnetron cathode of the apparatus. The target 1 is in a ring shape. A yoke 4 connected to a magnet 2 in a cylindrical column shape in the center is projected through the hole of the target to have the magnetic pole closer to the substrate than the target face. A yoke 5 in a circular shape is connected to a circular magnet at its circumferential portion. This magnetic pole is also closer to the substrate than the target face. Because of the effect provided by these yokes, sufficient magnetic force is exerted to cause cyclotron movement in the space in the vicinity of the target face. Further, if the quantity of the magnetic flux provided by the yoke 5 in the circumferential portion is made much larger than the quantity of the flux provided by the central yoke 4, for example, by making the volume and the pole area of the magnet and yoke in the circumferential portion larger, then the plasma is directed to the substrate in a narrow beam state, which is suitable for producing a magnetic thin film having large Barkhausen discontinuity characteristics.

In the present invention, most of the sputtered particles should be introduced to the substrate in an oblique direction. In a planer magnetron sputtering apparatus, the sputtered particles are propelled mainly in the direction of the normal line of the plane of the target, and the substrate is placed obliquely at an angle of from 5° to 85°, preferably from 10° to 40°, to the target. In FIG. 1A, the substrate 9 is placed by the holder 8 obliquely at 30° to the target 1.

Figure 2A:
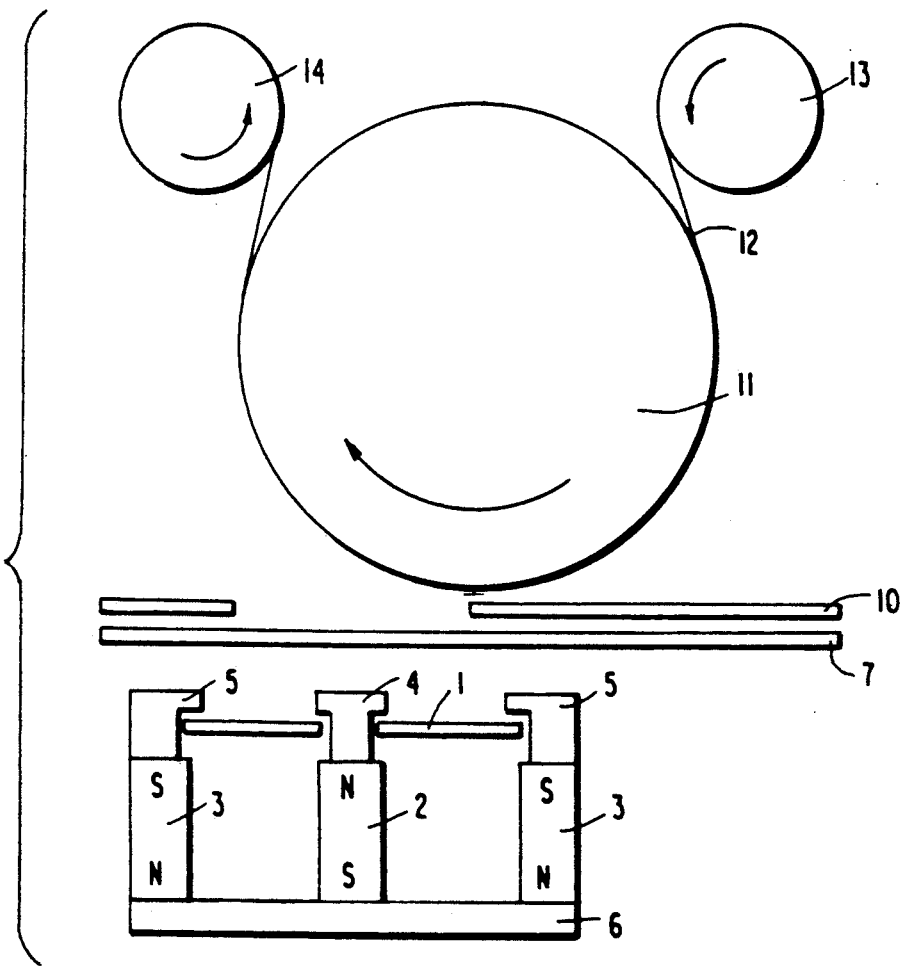
FIGS. 2A and 2B are schematic views of a continuous type of DC magnetron sputtering apparatus for producing the thin-film magnetic material of the present invention.
Figure 2B:
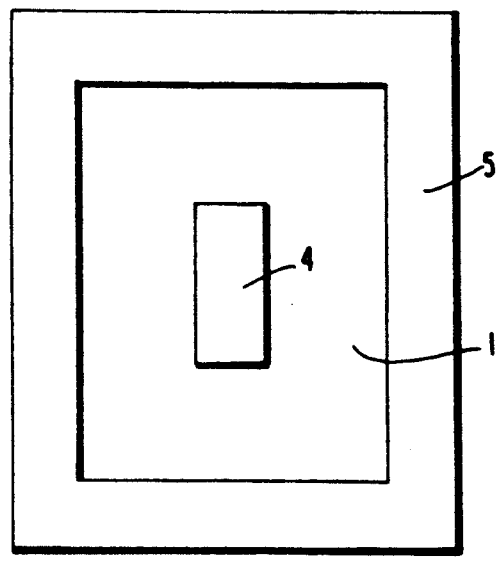

FIGS. 2A and 2B are schematic views of an apparatus comprising a DC magnetron sputtering apparatus employing a yoke, a roll-to-roll apparatus, and a baffle plate in combination for producing a magnetic thin film having large Barkhausen discontinuity characteristics. FIG. 2A is a schematic side view of the apparatus. FIG. 2B is a schematic plan view of the magnetron cathode of the apparatus.

During the time when an organic polymer film 12 wound on a lead-on roll 13 is supplied through a main roll 11 and is wound to a take-up roll 14, a magnetic thin film having large Barkhausen discontinuity characteristic is formed on the main roll 11 by a sputtering method. The main roll 11 has a curvature on which sputtered particles are obliquely deposited by limiting the direction of propulsion by using a baffle plate 10. The direction of propulsion is arbitrarily controlled by the position, the size, and the shape of the baffle plate. The planar magnetron cathode need not be placed just below the main drum. The target face need not necessarily be placed horizontally. Excessively large distance between the cathode and the main roll is not preferred because it lowers productivity.

III. Sensor

The magnetic material of the present invention does not require annealing after the film deposition and is a thin film material exhibiting large Barkhausen discontinuity without intentional application of external torsional or tensile stress on use. Therefore, it can be incorporated into a sensor having a small size and a flat shape which have not ever been previously produced, and are useful widely in various applications. In particular, the material is very useful as a marker for article surveillance apparatuses, pulse generating elements, magnetic sensors, and rotation sensors. These are explained below.

First, the marker for article surveillance apparatuses will be explained. The magnetic material of the present invention, when a cyclic magnetic field is applied as a calling signal in a surveillance area, will magnetically be reversed at the instant when the cyclic magnetic field reaches the critical magnetic field H* by large Barkhausen discontinuity, and will emit a magnetic field secondarily to the surroundings. The magnetic reversal by large Barkhausen discontinuity is extremely rapid so that the magnetic field generated includes high order harmonic waves of the frequency of the given magnetic field. The generation of the harmonic wave of the magnetic field is detected by the surveillance apparatus, which allows ready identification of the presence of the marker. The larger the portion of magnetic reversal by large Barkhausen discontinuity, the larger the intensity of signal of the harmonic wave components generated by the marker.

If the demagnetizing field is strengthened, the Barkhausen reversal is inhibited. The intensity of the demagnetizing field is evaluated in terms of the demagnetizing factor. The demagnetizing factor depends on the saturation magnetization of the material and the shape of the material. A thin film, because of its shape, generally has a smaller demagnetizing factor than bulk articles or thin wires. Therefore, the large Barkhausen discontinuity is not affected in thin films so much as in bulk articles or thin wires when the size of the marker is made smaller. For this reason, the marker of the present invention can be made thinner and smaller in comparison with amorphous metal wires used in conventional article surveillance markers of large Barkhausen discontinuity type.

Figure 7A:
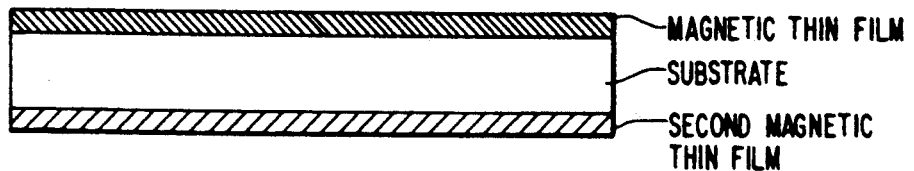
FIG. 7(A) is a sectional view of a magnetic marker having a non-magnetized bias layer formed on the back side of polymer substrate, opposite the layer having large Barkhausen discontinuity.
Figure 7B:
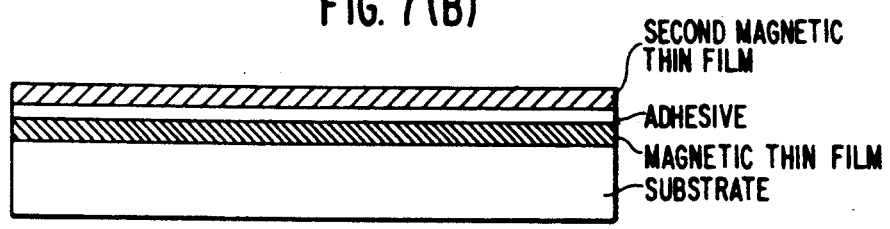
FIG. 7(B) is a sectional view of a magnetic marker having a bias layer formed directly on the layer having large Barkhausen discontinuity.

Further, in use of the magnetic material of the present invention for a marker, the detection by the surveillance apparatus is artificially inhibited by the formation, in addition to the magnetic layer causing large Barkhausen reversal, of one or more magnetic layers having a larger coercivity. By magnetizing the magnetic layer of higher coercivity, the residual magnetization of the magnetic layer applies a bias magnetic field to the large Barkhausen reversal layer, inhibiting the magnetic reversal naturally occurring in the large Barkhausen reversal layer, which inactivates the marker. This phenomenon is effectively utilized to allow undetected passage duly purchased articles or rightly lent books passing through the surveillance area. More specifically, the bias magnetic layer of the marker is demagnetized when books or the like are in a showcase, and the magnetic layer is magnetized at the counter in lending procedures, by which the residual magnetic layer of the bias magnetic layer produces a stronger magnetic field than the critical magnetic field $H^*$ of the large Barkhausen reversal layer. Consequently, the layer exhibiting large Barkhausen discontinuity is magnetized steadily in a certain direction, and does not react to changes in the external magnetic field. Thus, the inactivation of the marker allows the books rightly lent to pass through the surveillance area. A book not rightly lent, with a marker having non-magnetized bias layer transmits a signal by normal reversal in the large Barkhausen discontinuity layer at the change of external magnetic field by $H^*$ when the book is brought into the surveillance area, thus the non-lent book is not allowed to pass through the surveillance area. The bias layer may be of magnetically semi-hard metal such as Fe-Co-V type alloy in a shape of thin ribbon or a wire attached to an article. However, to more effectively use the material of the present invention, it is desirable to make the bias layer in a shape of a thin film as well. For example, a magnetic powder, such as magnetite, may be applied in a thin film, or the aforementioned Fe-Co-V thin film may be deposited by sputtering. As shown in FIG. 7(B), a bias layer may be formed directly on the large Barkhausen discontinuity layer. The bias layer may also be formed on the back side of a polymer substrate, as shown in FIG. 7(A). Otherwise, the bias layer is formed on another substrate and subsequently affixed to the large Barkhausen discontinuity material. The large Barkhausen discontinuity layer or the bias layer may be subjected to patterning by etching, printing, or lifting-off. The feasibility of such layer-doubling, and patterning with extreme ease, are still other advantages of the present invention in comparison with conventional markers, such as those employing amorphous metal wire.

The marker of the present invention can be identified, for example, with the apparatus disclosed in U.S. Pat. No. 4,660,025, discussed above.

The markers of the present invention, which are affixed to articles, are preferably constituted of a magnetic thin film held between two sheets of paper. For example, an adhesive tape is attached on the side to be attached to the article and a sheet of a protective paper is attached to the front side. By printing a bar code on the protective paper, the price and a description of the commodity can be identified optically.

Second, the magnetic sensor is explained below. The magnetic thin film having the large Barkhausen discontinuity characteristic will magnetically reverse instantaneously on application of an external magnetic field of the intensity of $H^*$. Therefore, $H^*$ or stronger magnetic field can be detected by the occurrence of the large Barkhausen discontinuity. The occurrence of the large Barkhausen discontinuity can be detected by induction of a pulse voltage in a pickup coil placed in proximity to the large Barkhausen discontinuity thin-film.

Figure 8:
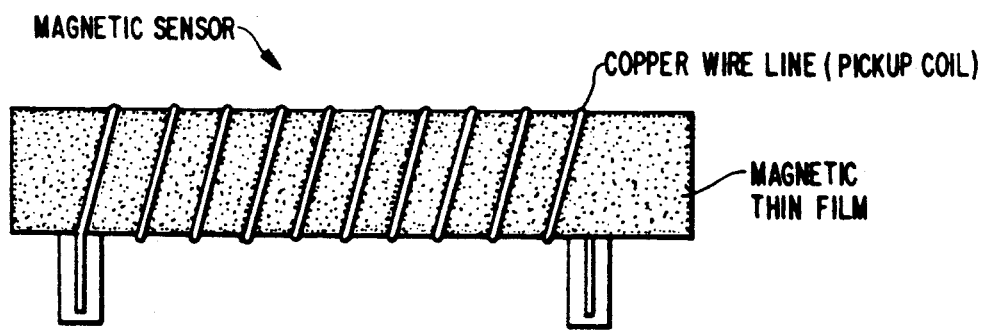
FIG. 8 is a plan view of a magnetic sensor utilizing the large Barkhausen discontinuity material according to the present invention.

As shown in FIG. 8, the pickup coil employed in the present invention may be prepared by winding copper wire around a large Barkhausen discontinuity thin-film as a magnetic core as conducted conventionally. It may also be made in a planar coil by use of a metal thin film, which is advantageous in making the pickup smaller and thinner. For example, it is prepared by printing with conductive paste in a particular pattern, or by forming a Cu pattern by sputtering. Such a layer may be formed on an insulating layer, such as one of $SiO_2$, on the large Barkhausen discontinuity layer. The coil portion may be formed on the back side of the polymer substrate of the large Barkhausen discontinuity thin-film by utilizing the polymer substrate as the insulating layer. Otherwise, the coil may be formed on another substrate and subsequently attached, through an insulating layer, to the magnetic core portion. The shape of the coil may be either of an outer core type or of an inner core type, or may be of various types such as a spiral type, a comb shape type, and a cloth inductor type. In particular, the simplified structure of the comb shape type is advantageous. The patterning may be conducted continuously by a wet etching method, a printing method, a lift-off method, or a dry etching method. The magnetic sensor may naturally be made smaller and thinner, and such simplified structure and ease of processes, such as patterning, are additional advantages of the present invention in comparison with the conventional magnetic sensor employing an amorphous metal wire.

The magnetic sensor is useful for various applications. In particular, the magnetic sensor is suitable for rotation sensors.

Figure 9:
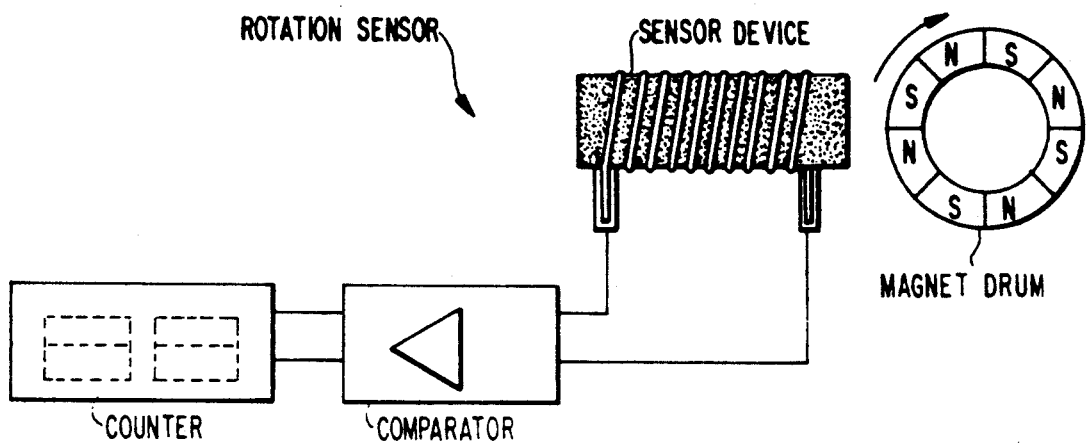
FIG. 9 is a diagram of a magnetic rotation sensor utilizing the large Barkhausen discontinuity material according to the present invention.

As shown in FIG. 9, the principle of the rotation sensor is as follows. At the periphery of the measured object such as a rotation axis, a permanent magnet or the like is equipped as a means for generating an external magnetic field. The sensor portion is placed in proximity to the rotation axis without direct contact therewith. At the instant when a magnetic field of the critical magnetic field $H^*$ is applied to the magnetic core as the rotation axis rotates and the magnetic field-generating means approaches the sensor portion, the magnetic core undergoes large Barkhausen reversal, thereby generating a pulse voltage in the coil. Thus one pulse signal is made in the coil whenever the magnetic field-generating means reaches the fixed position. The rotation speed is measured by counting the signals made per unit time.

This rotation sensor, which measures the rotation speed by counting the number of the pulses caused by large Barkhausen discontinuity, is capable of responding to a relatively slow change or a quick change of the magnetic field provided to the magnetic core. Thus, the rotation sensor is characterized by the capability of measuring rotation speed in a broad range of from a relatively slow speed to a high speed.

The magnetic field-generating means employed in the rotation sensor of the present invention is required to apply a magnetic field of $H^*$ or more to the sensor when the magnetic field-generating means attached to the rotation axis approaches the sensor. Although the magnetic field-generating means may be only one in number for the axis, a plurality of the means on the external circumference of the axis is preferably provided since it improves the precision of the measurement. By the same reason, the sensor may be only one in number for an axis, but a plurality of sensors may also be provided for an axis. An electromagnet or the like may be employed in place of the permanent magnet as the external magnetic field-generating means. If the magnetic force is insufficient, the magnetic field of H* or more cannot be not applied to the sensor, not causing large Barkhausen discontinuity in the magnetic core, which undesirably makes the measurement of rotation speed infeasible. Accordingly, it is desired to adjust the magnetic force of the permanent magnet or electromagnet appropriately, and the distance thereof to the sensor. Insofar as the above conditions are satisfied, a magnetic thin film with a magnetic powder coating having a large coercivity may be employed as the magnetic field application means. Since the sensor of the present invention is in a thin film shape and has a smaller demagnetizing factor, the large Barkhausen discontinuity characteristics of the sensor are affected less by miniaturization. Therefore, the sensor can be made smaller than those employing conventional amorphous metal wire or the like. This is important because the rotation speed of a microsized motor employing a sheet coil such as used in hand held cassette recorder can be measured by a sensor of an extremely small size and a simple structure. Thus the rotation sensor of the present invention is superior because of its simple structure and exceedingly compact small size.

As described above, the thin-film magnetic material exhibiting large Barkhausen discontinuity of the present invention is useful for broad range of applications and is promising industrially.

The present invention is described more specifically by reference to the following Examples.

EXAMPLE 1

A magnetically soft thin film of 0.5 μm was deposited on a PET film substrate 75 μm thick in a square shape having sides of 8 cm, by using a planer type DC magnetron sputtering apparatus as shown schematically in FIGS. 1A and 1B.

In the apparatus, the yokes 4 and 5, made of pure iron, were connected to the two ferrite magnets 2 and 3 placed under the target 1, bringing the magnetic poles of the yokes closer by 5 mm to the substrate than the target. The substrate face was held at an angle of 30° to the target face. The substrate holder having the film substrate in close contact was placed just above the target and was cooled with water.

An alloy target (purity: 99.9%) having the composition of $Fe_{75}Si_{10}B_{15}$ (atomic %) was used as the target. The target had a diameter of 10 cm, and the distance between the target and the center of the substrate was 100 mm.

The deposition of the film was conducted as follows. A vacuum chamber was evacuated to a pressure of $1\times10^{-6}$ Torr, and then Ar gas was introduced therein to a pressure of $3\times10^{-3}$ Torr. Sputtering was conducted by applying of DC current with a voltage of 400 V and a current intensity of 1 A, and grounding the substrate holder and the vacuum chamber to keep the both at the same potential. Incidentally, presputtering was conducted for 10 minutes with the shutter closed for the purpose of cleaning the target prior to the film deposition.

The structure of the deposited thin film was identified with an X-ray diffractometer RAD-RB made by Rigaku Denki Co. The cyclic magnetic characteristics (measuring frequency: 60 Hz) were evaluated with a magnetic hysteresis loop tracer ACBH-100K made by Riken Denshi Co.

Figure 3A:
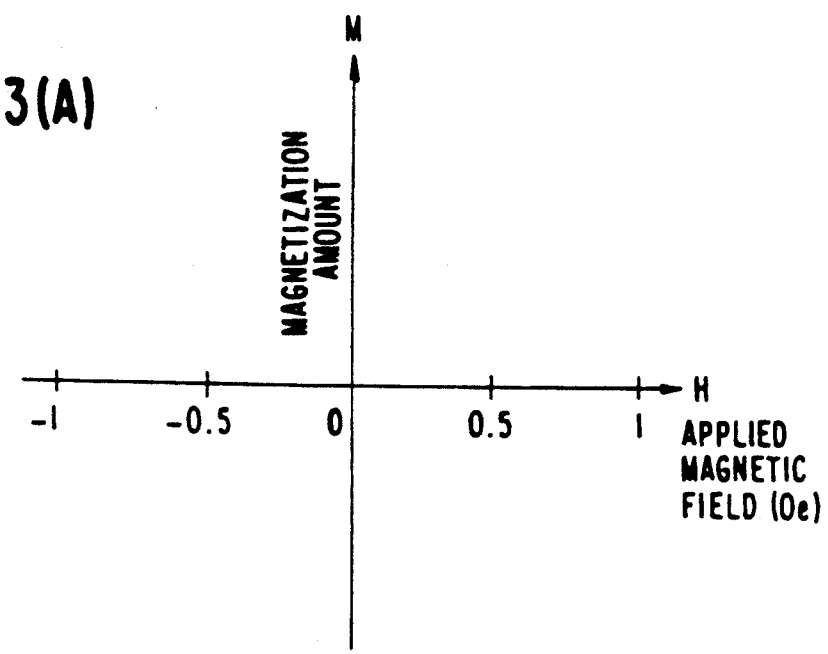
FIGS. 3A and 3B illustrate the change of magnetization observed on applying a cyclic magnetic field to the thin-film magnetic material prepared in Example 1.
Figure 3B:
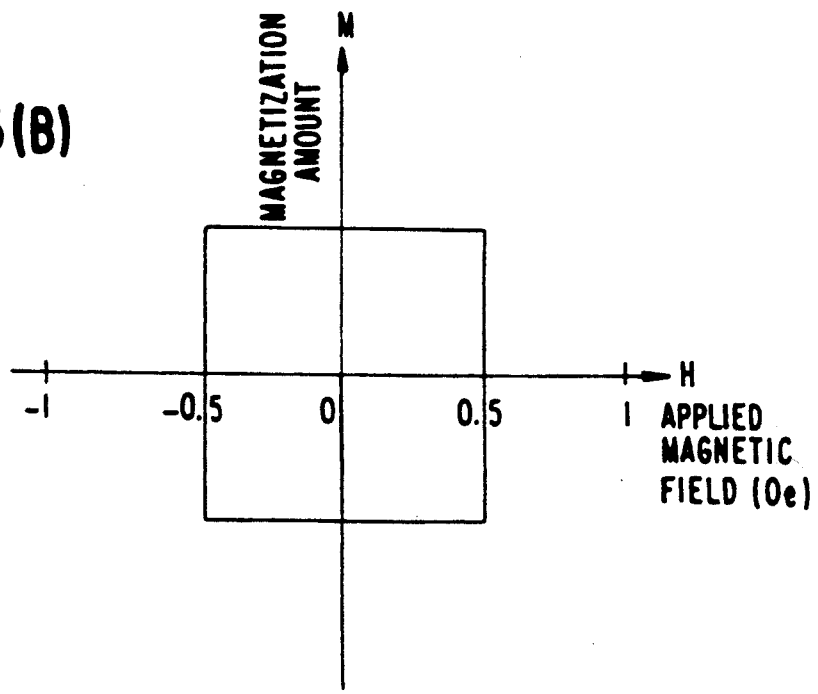

As a result, the prepared thin film was found to be in an amorphous single phase, and to have coercivity Hc of about 0.8 Oe. FIG. 3 illustrates the dependence of magnetization on application of cyclic magnetic field with the large Barkhausen discontinuity of the resulting sample being recognized (with the ordinate for magnetization and the abscissa applied magnetic field). No magnetization was observed in measurement in a cyclic magnetic field of 0.4 Oe as shown in FIG. 3A. On the other hand, FIG. 3B represents that a large magnetization was made in measurement in a cyclic magnetic field of more than 0.5 Oe, wherein the magnetization curve had a sharp discontinuous rise in magnetization, clearly showing large Barkhausen discontinuity.

EXAMPLE 2

Figure 5:
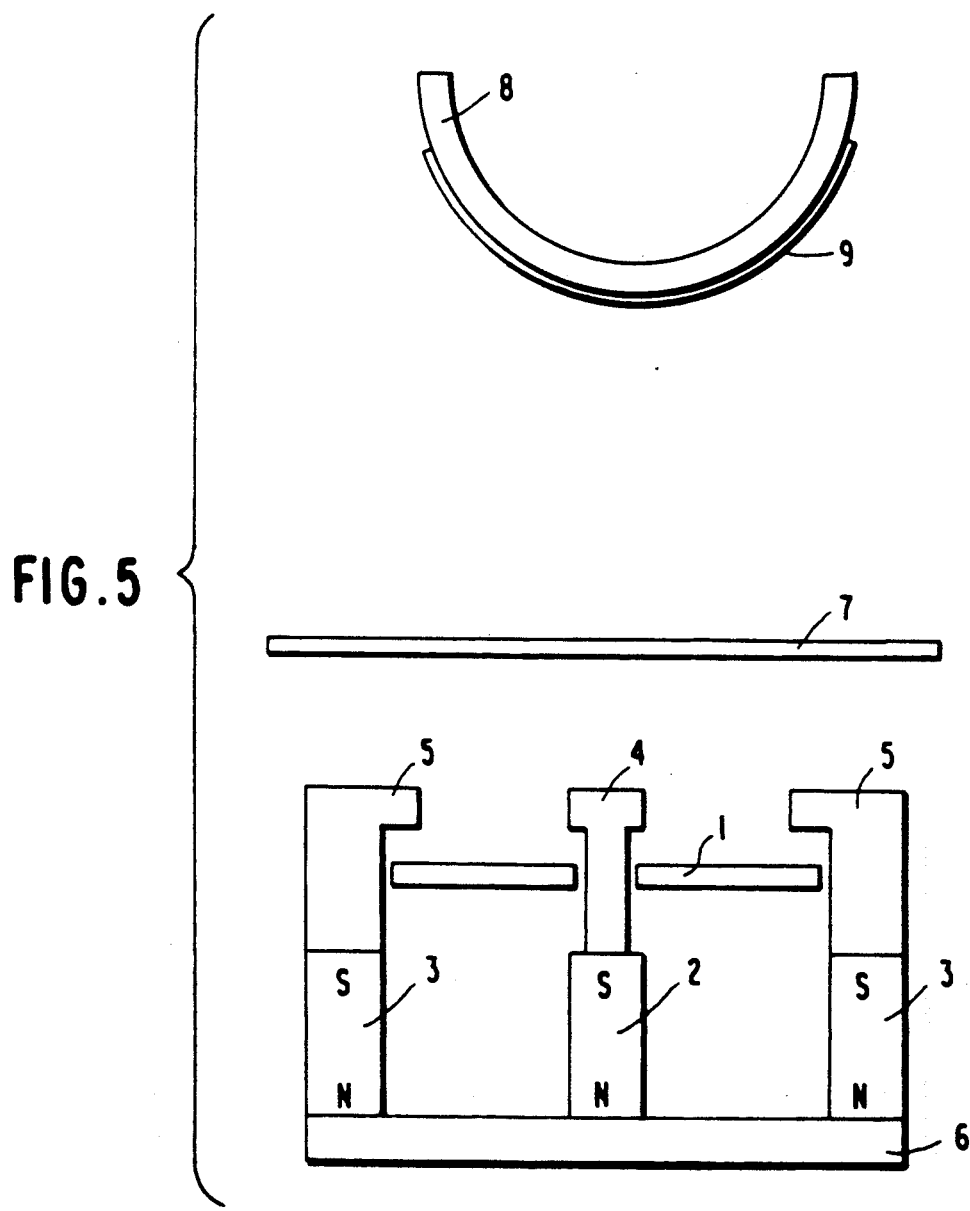
FIG. 5 is a schematic side view of another batch type of DC magnetron sputtering apparatus employing a curved substrate-holder for producing a thin-film magnetic material of the present invention. This apparatus is utilized in Example 5.

A soft magnetic thin film was prepared with the same sputtering apparatus as in Example 1 except that a curved substrate holder with curvature radius of 60 mm was used as shown in FIG. 5. The substrate holder was positioned to keep the shortest distance from the target at 100 mm. The composition of the target and the conditions of the film preparation were the same as in Example 1, except that the film formation process comprised two steps wherein the film was formed to the thickness of 0.2 μm through the first step and after 20 minutes thereof, the other thin-film with the thickness of 0.3 μm was formed thereon.

The resulting thin film had significantly varied magnetic characteristics depending on the measured position of the thin film. For example, the coercivity was distributed in the range of from about 0.2 Oe to about 5 Oe. The behavior of the magnetization also differed depending on the measured position, continuous magnetization being observed at the portion just above the target, and discontinuous jump of magnetization according to large Barkhausen discontinuity being observed at the positions apart from directly above the target. In particular, at the position approximately 30 mm apart from the central portion right above the target, where the angle between the substrate and the target face was about 30°, the magnetization curve exhibited two steps of extremely sharp discontinuous rise of magnetization in the measurement at cyclic magnetic fields of about 0.3 Oe and about 0.5 Oe, exhibiting large Barkhausen discontinuity. The magnetization by this large Barkhausen discontinuity was respectively about 15% and about 13% of saturation magnetization.

EXAMPLE 3

A magnetically soft thin film was continuously formed on an organic polymer substrate with a planar type DC magnetron sputtering apparatus as shown schematically in FIGS. 2A and 2B.

In this apparatus, yokes 4 and 5, made from pure iron, were connected to the two ferrite magnets 2 and 3 of the same material placed under the target 1, bringing the magnetic poles of the yokes closer by 5 mm to the substrate than the target. The ratio of the pole areas of the magnets in the central portion and circumferential portion, and that of the yoke, were both adjusted to be 1:2. A leakage magnetic field vertical to the substrate direction from the target was confirmed by leakage magnetic field measurement in the space over the target.

An alloy target (purity: 99.9%) having the composition of $Co_{75}Si_{10}B_{15}$ (atomic %) was used as the target 1. The target 1 had a long side of 50 cm and a short side of 15 cm. The shortest distance between the target 1 and the substrate 12 was 15 cm.

The organic polymer substrate 12 used was a polyester film 50 cm in width, 50 μm in thickness, and 100 m in length. This film was degassed by winding up in a vacuum chamber in an atmosphere of 125° C. at a rate 1 m/min., and was subsequently subjected to bombardment in an Ar atmosphere (vacuum degree: $6 \times 10^{-2}$ Torr).

Subsequently the vacuum chamber was evacuated to a pressure of $10^{-6}$ Torr, and Ar gas was introduced to a pressure of $3 \times 10^{-3}$ Torr. At this pressure, a DC electric field of 18 kw was applied at a voltage of 600V and a current intensity of 30 A.

During the deposition, a narrow-beamed plasma was confirmed to extend in a direction to the main roll 11 by visual observation.

The deposition was made on the film while the film 12 was in contact with the main roll 11. A baffle plate 10 was placed 1 cm lower than the main roll to hide a half portion of the feeding side of the main roll 11. The main roll was cooled with water to maintain the temperature of the substrate at 100° C. or lower.

Having conducted pre-sputtering for 30 minutes prior to the film deposition, the shutter was opened and a magnetically soft thin film of 0.5 μm was continuously deposited while the film was wound at a running speed of 0.5 m/min.

Figure 6A:
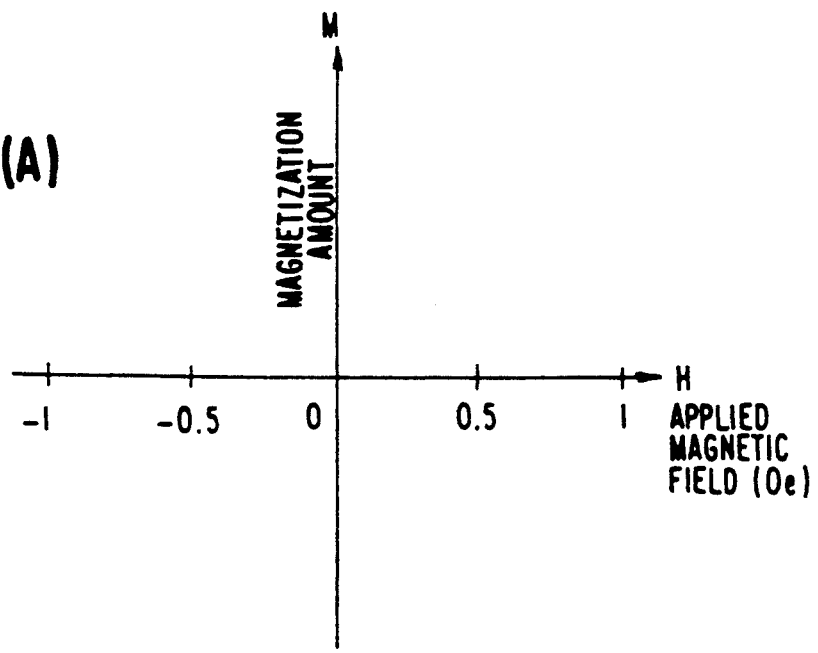
FIGS. 6A and 6B illustrate a change of magnetization on applying a cyclic magnetic field to the thin-film magnetic material prepared in Example 3.
Figure 6B:
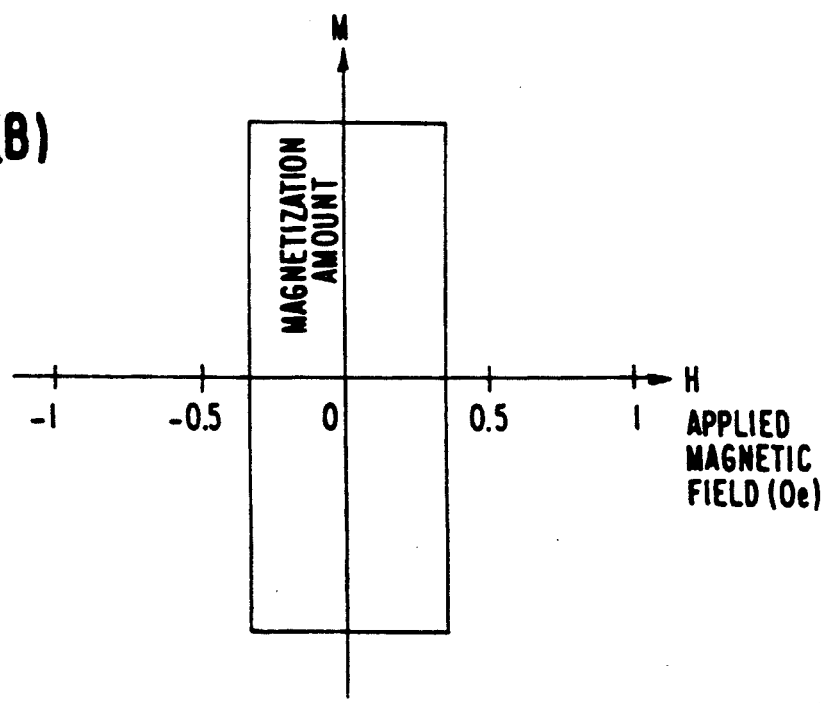

The thin film thus prepared was of an amorphous single phase, having a coercivity Hc of about 0.6 Oe. FIGS. 6 illustrates dependence of magnification on application of cyclic magnetic field with the large Barkhausen discontinuity of the resulting sample being recognized (with the ordinate for magnetization and the abscissa for applied magnetic field). No magnetization was observed in measurement in a cyclic magnetic field of 0.3 Oe as shown in FIG. 6A. On the other hand, FIG. 6B represents that a large magnetization was made in measurement in a cyclic magnetic field of more than 0.35 Oe, wherein the magnetization curve had a sharp discontinuous rise in magnetization, clearly showing large Barkhausen discontinuity. The quantity of the magnetization on the large Barkhausen discontinuity reached about 50% of the saturation magnetization. Significant variation of critical magnetic field was not observed in the length direction of the film.

COMPARATIVE EXAMPLE 1

Figure 4A:
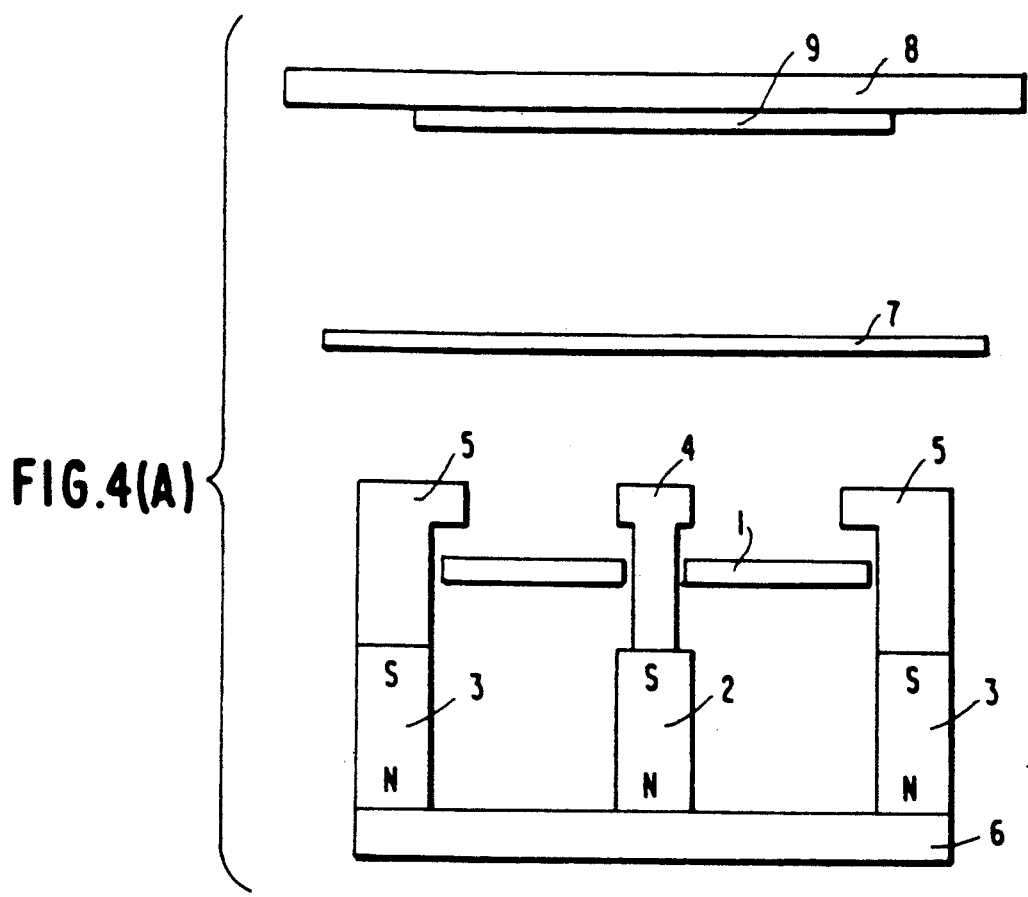
FIGS. 4A and 4B are a schematic views of a conventional DC magnetron sputtering apparatus employed in Comparative examples for producing a thin-film magnetic material.
Figure 4B:
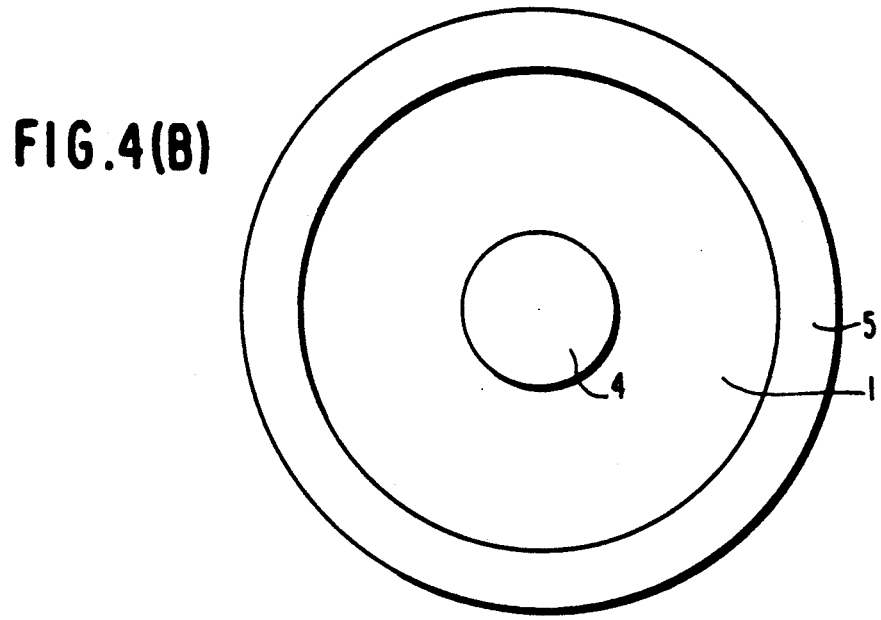

A magnetically soft thin film was prepared with the same apparatus as in Example 1 with the substrate and the target placed parallel, as shown in FIGS. 4A and 4B.

The composition of the target and the conditions for deposition were the same as in Example 1.

The magnetic characteristics of the formed thin film was measured by the magnetic hysteresis loop tracer. The coercivity Hc was 0.10 Oe. The magnetization was observed to change continuously without large Barkhausen discontinuity.

COMPARATIVE EXAMPLE 2

A magnetically soft thin film was prepared with the same apparatus as used in Example 3, in which a baffle plate with an opening having a width of 5% of the diameter of the main roll was positioned to have its opening aligned with the center line of the main roll to introduce sputtered particles roughly vertically to the substrate.

The composition of the target and the conditions for deposition were the same as in Example 3.

The magnetic characteristics of the formed thin film was measured by the thin-film magnetic hysteresis measurement apparatus. The coercivity (Hc) was 0.15 Oe. The magnetization was observed to proceed continuously without large Barkhausen discontinuity.

EXAMPLE 4

The thin film prepared in Example 3 was cut into a piece of 5 mm in width and 20 mm in length. This specimen was placed in a cyclic magnetic field of 1 Oe at frequency of 50 Hz. The voltage induced in a pickup coil by the magnetic field generated secondarily in the surroundings by magnetization of the specimen was analyzed for frequency with an FFT analyzer 5050A made by NF Co.

As the result, waves of up to 99-th harmonic wave of the calling frequency (50 Hz) were discernible, which is an excellent characteristic for use as an article surveillance magnetic marker.

COMPARATIVE EXAMPLE 3

The thin film prepared in Comparative example 1 was subjected to the same test as was conducted in Example 3. As the result, the waves above about 55-th harmonic waves were at a noise level or lower, below the measurable limit. Thus, this specimen exhibited insufficient performance, and is liable to malfunction as a marker in comparison with the sample in Example 3.

EXAMPLE 5

The film prepared in Example 3 was cut into a specimen of 10 mm in length and 5 mm in width. Around it, a coated copper wire of 50 μm in diameter was wound in 50 turns as a pickup coil to constitute a rotation sensor. This sensor was placed in cyclic magnetic fields of 1 Oe at frequencies of from 20 Hz to 600 Hz. A pulse voltage was induced in the pickup coil whenever the magnetic field reaches 0.35 Oe. Thus the sensor was satisfactory in detecting a magnetic field of 0.35 Oe positively.

Separately, a disc 10 cm in diameter and 5 mm in thickness was attached to a rotation axis of a motor. Four Sm-Co magnets in a cube shape having sides of 5 mm were attached at the circumference of the disc. The magnets were placed in equal intervals, and the different kinds of magnetic poles were directed alternately with respect to the circumference direction.

The sensor was placed in a direction such that the short side thereof faces the disc, and at a distance of 5 mm from the magnets. The magnetic field given to the sensor when the sensor comes to the closest position to the magnet was adjusted to 0.5 Oe. Under such conditions, the motor was driven at a rotation speed in the range of from 30 rpm to 300 rpm. The voltage generated in the coil of the sensor was measured with a digitaling oscilloscope 54201A made by Hewlett Packard Co.

As the result, the measured voltage exhibits steep pulse voltages nearly invariably from a low rotation speed to a high rotation speed, whereby the rotation speed could be measured by counting the number of the pulses.

While the invention has been described in detail and with reference to specific examples thereof, it will be apparent to one skilled in the art that various changes and modifications can be made therein without departing from the spirit and scope thereof.

What is claimed is:

1. A thin-film magnetic material having a magnetic thin film formed on a polymer substrate, the thin film exhibiting large Barkhausen discontinuity without intentional application of external torsional or tensile stress on use.

2. The thin film magnetic material of claim 1, wherein the magnetic thin film is substantially composed of an Fe-based or Co-based amorphous phase containing B, and exhibiting positive or negative magnetostriction.

3. The thin film magnetic material of claims 1 or 2, wherein the magnetic thin film is deposited by sputtering during which the normal line of the substrate is directed obliquely to a target.

4. The thin film magnetic material of claim 3, wherein the magnetic thin film is deposited by sputtering during which the normal line of the substrate is directed obliquely to a target at an angle in the range of from 5° to 85°.

5. The thin-film magnetic material of claim 3, wherein the magnetic thin film is deposited continuously by sputtering employing a roll-to-roll method.

6. A process for producing a thin-film magnetic material having a magnetic thin film formed on a polymer substrate and exhibiting large Barkhausen discontinuity without intentional application of external or tensile stress on use, the magnetic thin film being formed by sputtering on a substrate during which the normal line of the substrate is directed obliquely to a target plate.

7. The process for producing the thin-film magnetic material of claim 6, wherein the normal line of the substrate is directed obliquely to a target at an angle in the range of from 5° to 85°.

8. The process for producing the thin-film magnetic material of claim 6, wherein the normal line of the substrate is directed obliquely to a target at an angle in the range of from 10° to 40°.

9. The process for producing a thin-film magnetic material of claim 6, wherein the magnetic thin film is formed under application of a bias magnetic field by means of a permanent magnet or an electromagnet placed in proximity to the substrate.

10. The process for producing a thin-film magnetic material of claim 6 or 9, wherein the magnetic thin film is formed under application of a bias magnetic field by means of a multipole magnet placed on the back side of the holder supporting the substrate, opposite the magnetic thin-film forming side of said substrate.

11. The process for producing the thin-film magnetic material of any one of claims 6 to 9, wherein a cathode is employed which comprises a planar magnetron sputtering cathode having a magnet below the target, and a yoke magnetically connected to the magnet, one end of the magnetic pole of the yoke being placed above the face of the target.

12. The process for producing the thin-film magnetic material of claim 10, wherein a cathode is employed which comprises a planar magnetron sputtering cathode having a magnet below the target, and a yoke magnetically connected to the magnet, one end of a magnetic pole of the yoke being placed above the face of the target.

13. The process for producing a thin-film magnetic material of claim 6, wherein the magnetic thin film is formed by a roll-to-roll method.

14. The process for producing the thin-film magnetic material of claim 13, wherein a cathode is employed which comprises a planar magnetron sputtering cathode having a magnet below the target, and a yoke magnetically connected to the magnet, one end of a magnetic pole of the yoke being placed above the face of the target.

15. The process for producing a thin-film magnetic material of claim 6, wherein the magnetic thin film is formed on the substrate while it is in contact with a curved substrate holder.

16. The process for producing a thin-film magnetic material of claim 13 or 15, wherein a baffle plate is placed between the substrate holder and the target to deposit the thin film at positions where the normal line of the substrate of the thin film is inclined at an angle of from 5° to 85° to the face of the target.

17. The process for producing a thin-film magnetic material of claim 16, wherein the baffle plate is placed between the substrate holder and the target to deposit the thin film at positions where the normal line of the substrate of the thin film is inclined at an angle of from 10° to 40° to the face of the target.

18. A marker for use in an article surveillance system for identifying an article by forming a cyclic magnetic field of a predetermined frequency in a surveillance area, attaching a magnetic marker to the article to be identified, and detecting a harmonic frequency of the magnetic field generated by the article brought into the surveillance area; the marker being constituted of a thin-film magnetic material formed on a polymer substrate and exhibiting large Barkhausen continuity without intentional application of external torsional or tensile stress on use.

19. The marker of claim 18, wherein, in the vicinity of the magnetic material exhibiting large Barkhausen discontinuity, a second magnetic material is placed which is capable of generating a magnetic field more intense than the critical magnetic field for large Barkhausen discontinuity by remanent magnetization and has a higher correctivity than the magnetic film exhibiting large Barkhausen discontinuity in order to inhibit the generation of harmonics even when the marker is in the surveillance area.

20. The marker of claim 19, wherein the second magnetic material is composed of a thin-film magnetic material.

21. A magnetic sensor, constituted of a magnetic core portion and a coil portion placed around the magnetic core portion, the core portion comprising a magnetic thin film material which exhibits large Barkhausen discontinuity without intentional application of external torsional or tensile stress on use.

22. The magnetic sensor of claim 21, wherein the coil portion is constituted of a thin-film electroconductive material.

23. The magnetic sensor of claim 21, wherein the coil portion is constituted of a thin-film electroconductive material supported by a polymer substrate separated from the substrate of the core portion, and the magnetic core portion is in opposition to the coil portion with interposition of an insulating layer.

24. The magnetic sensor of claim 21, wherein the sensor is supported by a polymer substrate, and the magnetic core portion is placed on one side thereof, and the coil portion is placed on another side thereof.

25. A rotation sensor constituted of a magnetic sensor composed of a magnetic core portion and a coil portion placed in proximity to the magnetic core portion, and a magnetic field-applying means composed of a permanent magnet or an electromagnet, the magnetic field-applying means being attached to a rotating article, and the magnetic sensor being placed in proximity to the magnetic field-applying means and comprising a thin-film magnetic material formed on a polymer substrate and exhibiting large Barkhausen discontinuity without intentional application of external torsional or tensile stress on use.

* * * * *